(12) United States Patent
Ishikura et al.

(10) Patent No.: US 7,005,047 B2
(45) Date of Patent: Feb. 28, 2006

(54) FILM DEPOSITION APPARATUS AND FILM DEPOSITION METHOD

(75) Inventors: Junri Ishikura, Tokyo (JP); Makoto Kameyama, Chiba (JP); Yasuyuki Saito, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 182 days.

(21) Appl. No.: 10/421,777

(22) Filed: Apr. 24, 2003

(65) Prior Publication Data
US 2003/0228425 A1 Dec. 11, 2003

(30) Foreign Application Priority Data

Apr. 24, 2002 (JP) ............................. 2002-122314
Apr. 22, 2003 (JP) ............................. 2003-117358

(51) Int. Cl.
*C23C 14/00* (2006.01)

(52) U.S. Cl. .......................... 204/298.41; 118/723 VE; 118/723 HC (58) Field of Classification Search ......... 118/723 VE, 118/723 HC; 204/298.41
See application file for complete search history.

(56) References Cited

U.S. PATENT DOCUMENTS

| 4,994,164 A | * | 2/1991 | Bernardet et al. ..... 204/298.41 |
| 5,445,777 A | * | 8/1995 | Noel et al. .................... 264/113 |
| 5,858,450 A |   | 1/1999 | Fujimura et al. .............. 427/9 |
| 6,383,050 B1 |   | 5/2002 | Ishikura et al. ................ 445/41 |
| 6,497,917 B1 |   | 12/2002 | Ishikura .......................... 427/9 |
| 6,562,200 B1 |   | 5/2003 | Iwase et al. ........... 204/192.12 |
| 6,645,354 B1 | * | 11/2003 | Gorokhovsky ......... 204/192.38 |
| 6,702,934 B1 | * | 3/2004 | DeLeon et al. ........ 204/298.41 |
| 6,797,336 B1 | * | 9/2004 | Garvey et al. .............. 427/561 |

FOREIGN PATENT DOCUMENTS

| EP | 1 020 889 A1 | 7/2000 |
| JP | 90016379 | 4/1990 |
| JP | 5-47771 | 2/1993 |
| JP | 7-37512 | 2/1995 |
| JP | 08-109463 | * 4/1996 |
| JP | 2524622 | 8/1996 |
| JP | 2596434 | 4/1997 |
| JP | 2632409 | 7/1997 |
| JP | 10-140325 | 5/1998 |
| JP | 2000-17427 | 1/2000 |
| JP | 2000-208033 | 7/2000 |
| WO | WO 98/58095 | * 12/1998 |

OTHER PUBLICATIONS

The American Heritage Dictionary, 4th ed., Random House, 201, p. 856.*

* cited by examiner

*Primary Examiner*—Richard Bueker
(74) *Attorney, Agent, or Firm*—Fitzpatrick, Cella, Harper & Scinto (57) ABSTRACT

A particle film deposition apparatus and method are provided, with which ultra fine particles are generated by arc heating. The generated ultra fine particles can be efficiently sucked up into a transfer tube regardless of an arc voltage, and the resulting film can be stable in shape. An evaporation material 8 to be evaporated by arc heating and to generate ultra fine particles is connected to an electrode. As other electrodes, a plurality of rods 17 each having a discharge section at the tip thereof are provided. These rods 17 are so arranged as to be directed in each different direction with respect to the evaporation material 8.

4 Claims, 6 Drawing Sheets

FILM DEPOSITION APPARATUS AND FILM DEPOSITION METHOD

This application claims the right of priority under 35 U.S.C. § 119 based on Japanese Patent Application Nos. JP 2002-122314 filed on Apr. 24th, 2002 and JP2003-117358 filed on Apr. 22, 2003 which are hereby incorporated by reference herein their entirety as if fully set forth herein.

BACKGROUND OF THE INVENTION

1. Field of the Invention

The present invention relates to a film deposition apparatus and a film deposition method using ultra fine particles formed by arc heating method.

2. Description of the Related Art

Conventionally, the film deposition apparatus of the above type is exemplified by the one having gas deposition method applied thereto.

Such a gas deposition apparatus is structured by, for example, a ultra-fine particle generation chamber, a film deposition chamber, and a transfer tube for connection between the ultra-fine particle generation chamber and the film deposition chamber. In the ultra-fine particle generation chamber, arc heating, resistance heating, high-frequency induction heating, laser heating, or the like evaporates materials in inert gas atmosphere. Then, colliding the resulting evaporated materials against the inert gas generates ultra fine particles, each ranging in diameter from a few nm to a few μm. The ultra-fine particle generation chamber is so set as to be higher in pressure than the film deposition chamber. Due to the pressure difference, the ultra fine particles generated in the ultra-fine particle generation chamber are led to the film generation chamber via the transfer tube. Here, an end portion of the transfer tube is placed in the film deposition chamber, and the end portion is nozzle-shaped. From this nozzle, the ultra fine particles are ejected at high speed toward a substrate placed in the film deposition chamber. As such, colliding the ultra fine particles against the substrate leads to any desired pattern in a direct manner. For details, see Japanese Patents No. 2524622, No. 1595398, No. 2632409, and No. 2596434.

Such a gas deposition method has been considered applicable to varying areas such as electrical wiring (see JP-A-5-47771), bump-shaped electrodes (see JP-A-10-140325), and joint members (see JP-A-7-37512).

The ultra fine particles are generated by induction heating, arc heating, resistance heating, or the like. The ultra fine particles made of high melting point materials exemplified by zirconium (Zr) or vanadium (V) may be possibly used as non-evaporating getters due to their specific surface size (see JP-A-2000-208033). For such a high melting point metal, arc heating works effectively.

In a case of forming electrical wiring by gas deposition using silver (Ag) or aluminum (Al) which is not the high melting point material, arc heating works also effectively in view of film deposition at high rate with more evaporation.

Figure 5:
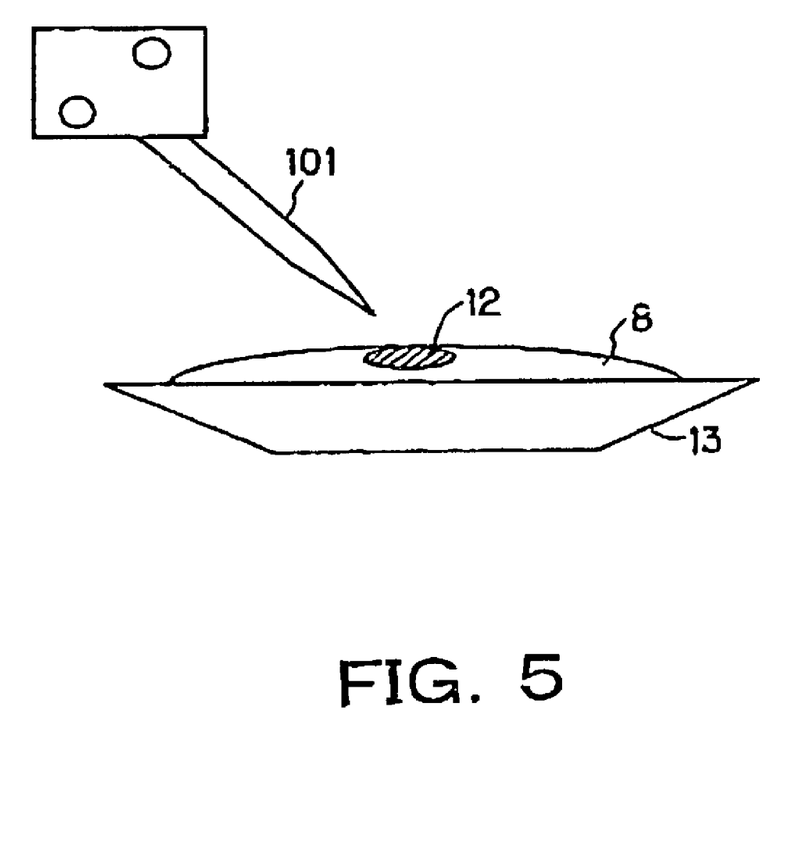
FIG. 5 is a schematic diagram showing an electrode whose tip is pointed according to the prior art.

For arc heating, usually, as shown in FIG. 5, the ultra-fine particle generation chamber includes an electrode arm, at the tip of which is attached with a tip-pointed rod electrode 101. Then, generally, discharge is caused between the tip of the rod electrode 101 and a material 8 to be evaporated (see JP-A-2000-17427 and Japanese Patent No. 2596434).

Here, in FIG. 5, a reference numeral 13 denotes a carbon-made hearth liner (carbon-made container) having a concave part on which the material 8 is placed. A reference numeral 12 denotes a part where the material 8 is to be melted.

To maintain the stable evaporation of the material 8, the rod electrode 101 is so angled as to form a few tens of degrees in the vertical direction with respect to the material 8.

When the rod electrode 101 is put in an upright position, lengthwise, with respect to the surface of the material 8, the evaporated material 8 tends to adhere to the rod electrode 101. This results in deformation of the tip of the rod electrode 101 which renders evaporation of the material 8 unstable.

Conversely, when the rod electrode 101 is put in a parallel position, lengthwise, with respect to the surface of the material 8, the generated ultra fine particles are blown off in the direction opposite to the rod electrode 101. As a result, the particle smoke, i.e., the ultra-fine particle flow, becomes difficult to be sucked up into the transfer tube located above the material 8.

Figure 6:
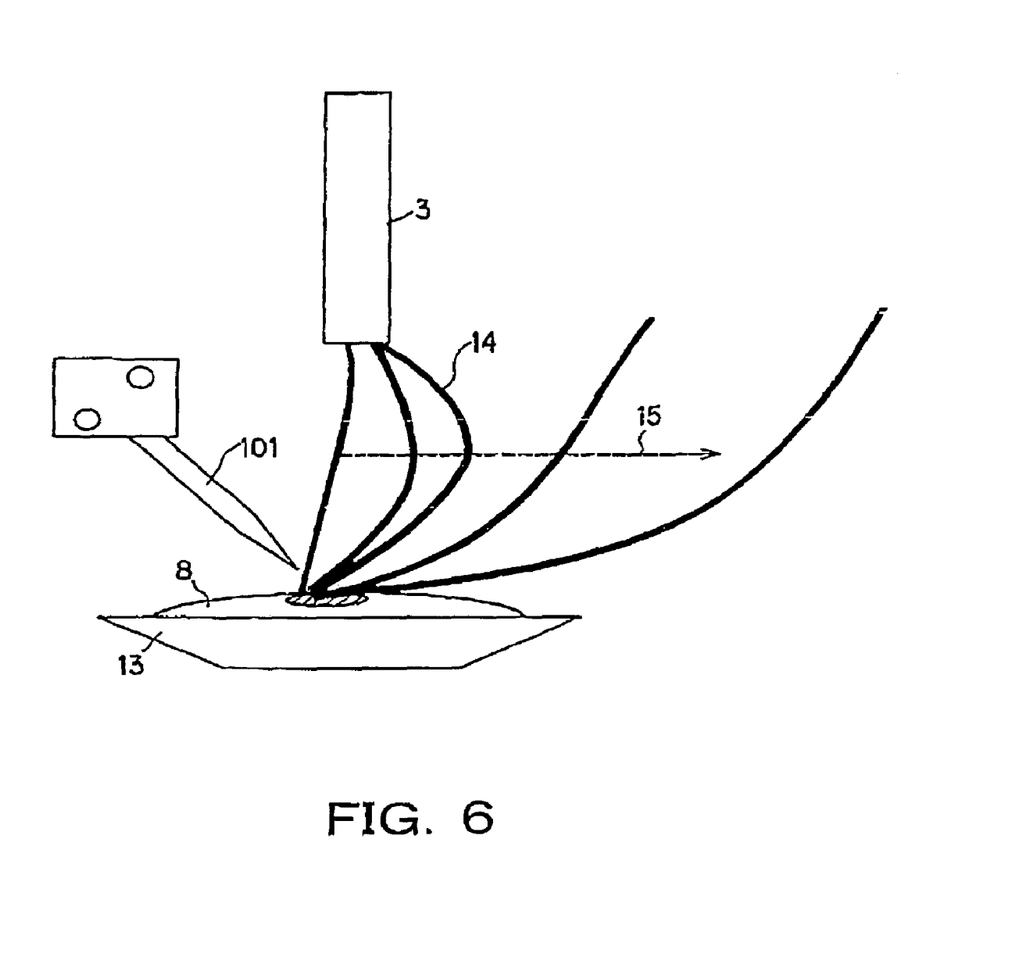
FIG. 6 is a schematic diagram showing the state of a ultra-fine particle smoke generated from a material flowing into a direction opposite to an electrode when arc power is increased.

FIG. 6 is a diagram for illustrating the state of the generated ultra-fine particle smoke, i.e., the ultra-fine particle flow, 14.

In FIG. 6, by putting the rod electrode 101 into a horizontal position from the state shown in FIG. 6, i.e., by putting the rod electrode 101 into a parallel position, lengthwise, with respect to the surface of the material 8, the generated ultra fine particles start being blown off in the direction opposite to the electrode 101, i.e., the direction indicated by an arrow 15. This makes the ultra-fine particle smoke 14 difficult to be sucked up into a transfer tube 3 located above the material 8.

This tendency becomes more noticeable with the higher arc voltage, and with the larger angle of the rod electrode 101 with respect to the vertical direction, i.e., as the rod electrode 101 becomes more parallel, lengthwise, with respect to the surface of the material 8.

Such a phenomenon may be caused by the collision of the flow of the thermoelectron emitted from the rod electrode 101 and the generated ultra-fine particle smoke 14. Such a collision may blow off the ultra fine particles in the direction opposite to the electrode 101.

Therefore, conventionally, to achieve the more efficient leading of the particle smoke 14 to the suction part of the transfer tube, the rod electrode 101 is angled about 30 to 45 degrees with respect to the vertical direction as shown in FIG. 6. In addition, applied is a method for adjusting the arc voltage and the arc current values.

SUMMARY OF THE INVENTION

The above conventional technology, however, carries the following problems.

In such a method as shown in FIG. 6, the arc electrode, i.e., rod electrode, 101 is so located as to form an appropriate angle with respect to the surface of the material 8, and arc discharge is caused between the material 8. Assuming that the arc current is constant, the higher arc voltage, the larger the energy of the thermionic current coming from the rod electrode 101 becomes. If this is the case, the particle smoke 14 is strongly bent in the direction further away from the rod electrode 101, i.e., in the direction of the arrow 15. Consequently, the particle smoke 14 becomes difficult to be sucked up into the transfer tube 3.

Thus, to achieve the more efficient suction of the particle smoke 14 into the transfer tube 3, the distance between the electrode and the material has to be adjusted to keep the arc voltage low. This adjustment has to be done while visually checking the particle smoke 14 to be always within the range covered by the suction part of the transfer tube 3. Consequently, the characteristics of arc heating method allowing film deposition at high rate cannot be fully taken advantage of.

Moreover, considered is a case of film deposition in line by ejecting the ultra fine particles from the nozzle onto a moving substrate in the film deposition chamber. In this case, if the ultra-fine particle smoke 14 is sucked up at the edge portion of the transfer tube 3, the cross section of the resulting linear film may has a shape with a peak of film thickness shifted to the edge portion thereof.

This shift of film thickness is depending on the part of the transfer tube 3 where the particle smoke 14 is sucked up. As the suction part is closer to the edge portion of the transfer tube, a peak of film thickness tends to be further shifted to the edge portion in the cross section of the resulting film.

Furthermore, this shift is sensitive to the voltage. Even a slight voltage fluctuation will affect the direction the particle smoke 14 goes. Thus, it has been difficult to obtain a film whose cross section is stable in shape.

The present invention is proposed to solve the above problems, and an object thereof is to provide a film deposition apparatus and a film deposition method for forming particles by arc heating. With the film deposition apparatus and method, the resulting particles can be efficiently sucked up into a transfer tube regardless of an arc voltage, and the resulting film can be stable in shape.

One aspect of the present invention is a film deposition apparatus for depositing a film by generating arc discharge by a potential difference between a first and second electrodes, evaporating a material by the arc discharge, generating particles from the evaporated material and colliding the particles against a substrate, the material being electrically connected to the second electrode, and the first electrode being provided with a plurality of sub-electrodes, wherein tips of the plurality of sub-electrodes are directed in directions different from each other with respect to the material.

It is preferable that the tips of plurality of sub-electrodes are directed in directions different from each other with respect to a vertical direction of a surface of the material.

It is preferable that the plurality of sub-electrodes are so provided as to heat substantially the same part of the material.

It is preferable that the plurality of sub-electrodes are provided approximately radially to a specific part of the material.

It is preferable the plurality of sub-electrodes are rod electrodes arrange in different lengthwise directions.

It is preferable that the sub-electrodes each include any one material W, Ta, Mo, or C.

It is preferable to further comprise: a first chamber in which the first electrode and the material are placed; a second chamber in which the substrate and a stage to which the substrate is fixed are placed; and a transfer tube for connecting the first chamber and the second chamber.

another aspect of the present invention is a film deposition method, comprising the steps of: (A) preparing a first electrode including a plurality of sub-electrodes, a second electrode, and a material electrically connected to the second electrode and evaporated by arc discharge; (B) evaporating the material by causing the arc discharge simultaneously among the material and the plurality of sub-electrodes; (c) generating particles from the evaporated material; and (D) colliding the particles against a substrate, wherein each of the plurality of sub-electrodes are faces the material in mutually different directions.

It is preferable that tips of the plurality of sub-electrodes are directed in directions different from each other with respect to a vertical direction of a surface of the material.

It is preferable that the plurality of sub-electrodes each heat substantially the same part of the material.

It is preferable that the plurality of sub-electrodes are provided approximately radially to a specific part of the material.

It is preferable that the plurality of sub-electrodes are rod electrodes arranged in different lengthwise directions.

It is preferable that the sub-electrodes each include any one material W, Ta, Mo, or C.

It is preferable to further comprise the steps of: preparing a first chamber in which the first electrode and the material are placed; preparing a second chamber in which the substrate and a stage to which the substrate is fixed are placed; preparing a transfer tube for connecting the first chamber and the second chamber; and setting a pressure of the second chamber lower than a pressure of the first chamber.

In the present invention, each sub electrodes are arranged at mutually different direction with respect to a material. In an exemplary structure, the sub electrodes are arranged so that the material is surrounded, and a vector sum of thermionic current from the tips of the sub electrodes (discharge sections) is directed to any one specific part of the material (preferable if directed in the vertical direction of the material surface). With such a structure, no matter what arc voltage is to be applied, the ultra-fine particle smoke (particle flow) generated by arc discharge is not blown off into a wrong direction but efficiently sucked up into a transfer tube with the carrier gas flow coming from the bottom part of the evaporation source. Further, the particle smoke becomes easier to be sucked up into the center of the suction part of the transfer tube. Accordingly, the resulting film can be stable in shape, and the cross section thereof is thicker in the center.

DETAILED DESCRIPTION OF THE PREFERRED EMBODIMENTS

In the below, a preferred embodiment of the present invention is described by way of example referring to the accompanying drawings. Herein, constituents are not restrictive in size, material, shape, and relative layout to those described in the following embodiment, and it is understood that numerous other modifications and variations can be devised without departing from the scope of the invention.

Figure 1:
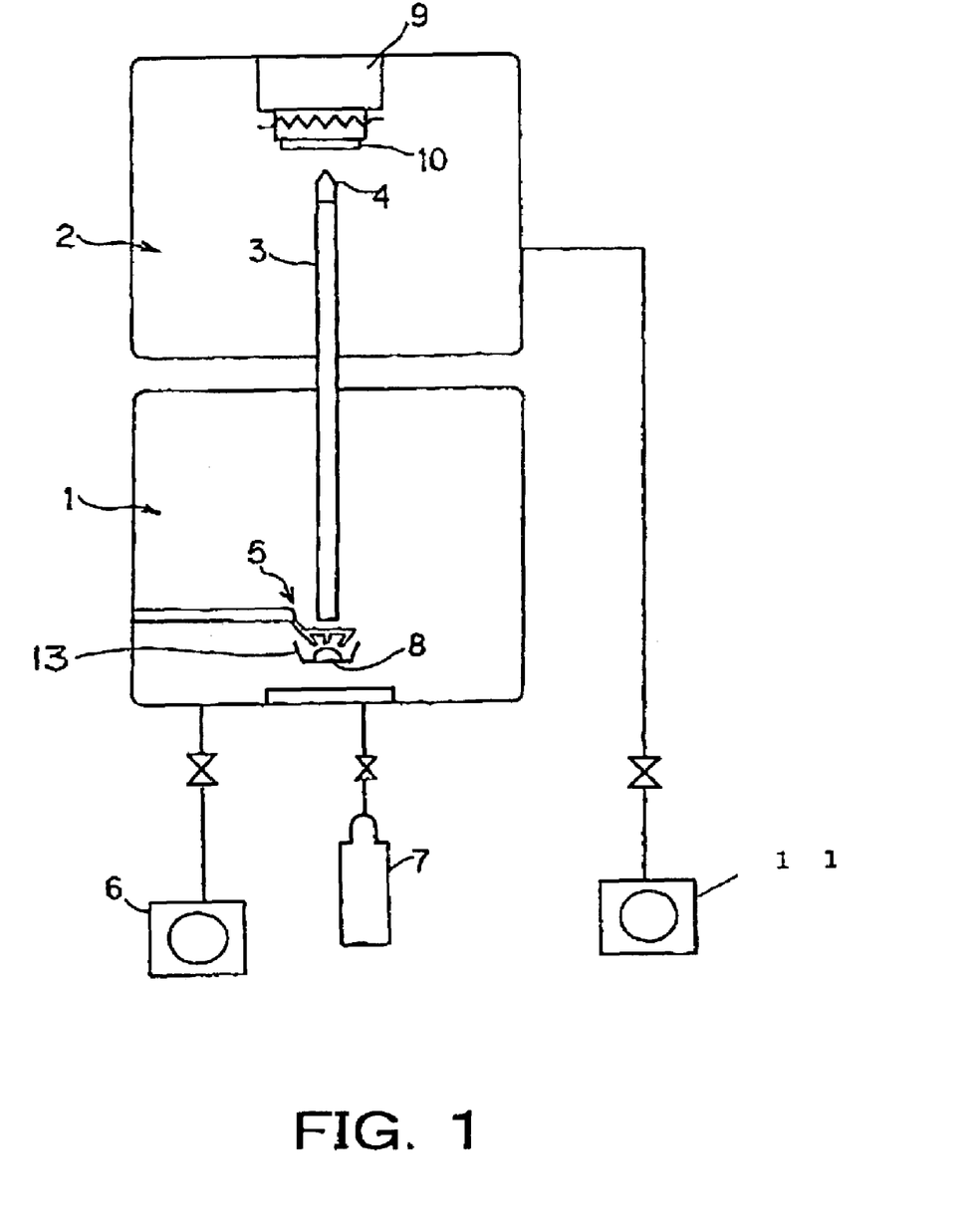
FIG. 1 is a schematic diagram for illustrating the structure of a ultra fine particle film generation apparatus according to an embodiment of the present invention.

FIG. 1 shows a schematic diagram showing the structure of a film deposition apparatus according to the embodiment of the present invention. The film deposition apparatus of the present embodiment is characterized in having gas deposition applied thereto.

In FIG. 1, a reference numeral 1 denotes a first chamber (sometimes referred to as "particle generation chamber"), and a reference numeral 2 denotes a second chamber (sometimes referred to as "particle film deposition chamber") The reference numeral 3 denotes the transfer tube, and a reference numeral 4 denotes a nozzle attached to the tip of the transfer tube 3 placed in the second chamber. Here, the nozzle 4 may be a member provided separately from the transfer tube, or the tip of the transfer tube may be shaped nozzle as a substitute therefor. A reference numeral 5 is a first electrode for arc discharge, and at the tip thereof, a plurality of rod-shaped sub electrodes are provided. A reference numeral 6 denotes first pressure control means for controlling the pressure in the first chamber 1, and a reference numeral 7 denotes a carrier gas cylinder containing carrier gas exemplified by inert gas. The reference numeral 8 denotes the material to be evaporated by arc discharge, and the material is sometimes referred to as "evaporation material". The material is electrically connected to a second electrode, which is not shown. A reference numeral 9 denotes a stage to which a substrate 10 is fixed. A reference numeral 11 denotes second pressure control means for controlling the pressure in the second chamber 2. Note here that, the pressure inside of the first chamber 1 is maintained in a state higher than the pressure inside of the second chamber 2. Applying any desired voltage between the first and second electrodes will cause arc discharge between the tips of the sub electrodes and the evaporation material 8, thereby causes an evaporation from a part of the material 8 continuously. Then, collision between atoms as a result of evaporation of the material 8 and the carrier gas will generate the ultra fine particles. The generated ultra fine particles are sucked up from the tip of the transfer tube utilizing the pressure difference between the first and second chambers, and transferred into the second chamber. Then, through the nozzle at the tip of the transfer tube 3 located in the second chamber, the particles are ejected toward the substrate 10. In such a manner, a film is formed on the substrate 10.

FIG. 1 shows an example in which the particle generation chamber 1 in which the material (evaporation material) 8 is placed on a carbon-made hearth liner(carbon-made container) 13 connected to second electrode.

The material 8 in the particle generation chamber 1 is heated and evaporated by arc discharge caused by the voltage applied between the arc heating electrode (first electrode) 5 and the second electrode connected to the liner (container) on which the material 8 is placed.

Further, the particles thus generated in the particle generation chamber 1 are led to the particle film deposition chamber 2 together with the carrier gas via the transfer tube 3. Here, in the present invention, "fine particles" and "particles" are those, preferably, each ranging in diameter from a few nm to several $\mu$m. Then, in the particle film deposition chamber 2, the particles are ejected at high speed from the nozzle 4 attached to the tip of the transfer tube 3 together with the carrier gas (helium gas 7). In this manner, a fine particle film is formed on the substrate 10 attached to the stage 9 for film deposition thereon.

The stage 9 controllably moves toward the nozzle 4, and in the direction approximately orthogonal to the nozzle 4.

At the time of film deposition, heating the substrate 10 is preferable because forming of a film on the substrate is improved. Similarly, film heating and melting during or after film deposition is also preferable for better film attachment.

The electrode 5, which is the structural characteristic of the present embodiment, is provided with a plurality of rods (sub-electrodes) at the tip thereof to be used as a plurality of electrodes each including a discharge section. Here, it is preferable if each of the rod tips faces the material 8 in mutually different directions. In the present invention, the rods are preferably directed, lengthwise, to directions different from each other with respect to the material 8.

Similarly, it is preferable if each discharge section is arranged in such a direction as to heat substantially the same part of the material 8. In other words, the rods are each directed, lengthwise, toward the same part of the material 8, that is, the melting part 12.

It is also preferable if the discharge sections are provided approximately radially to any one specific part of the material 8. In other words, it is preferable if the rods are directed, lengthwise, to any one specific part of the material 8, i.e., the melting part 12, and are provided approximately radially around the part.

In the following examples, the arc heating electrode 5, which is the structural characteristic of the present embodiment, is described in more detail. Note here that, any constituent already described in the Related Art section and Preferred Embodiment is provided with the same reference numeral, and not described again.

EXAMPLE 1

Figure 2A:
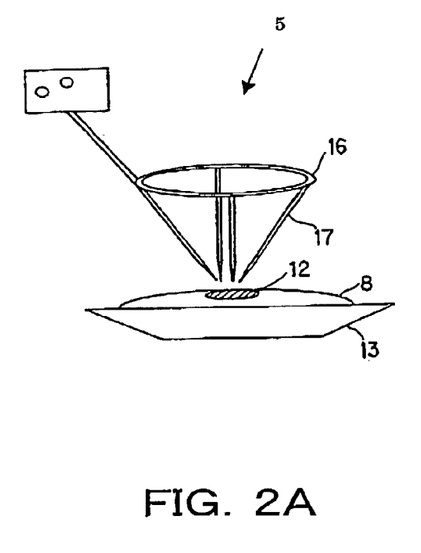
FIGS. 2A and 2B are both schematic diagrams showing an electrode provided with four discharge sections in Example 1.
Figure 2B:
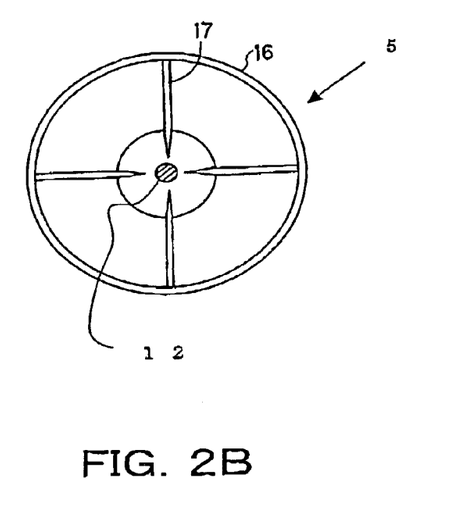
Figure 3A:
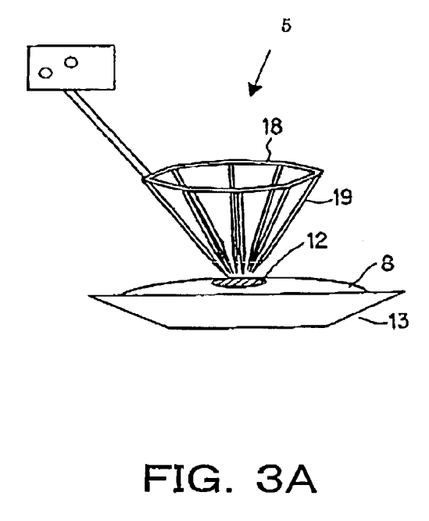
FIGS. 3A and 3B are both schematic diagrams showing an electrode provided with eight discharge sections in Example 2.
Figure 3B:
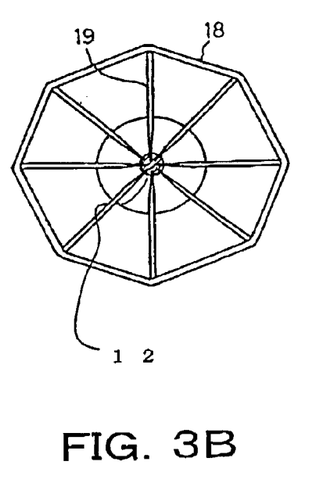

FIGS. 2A and 2B are both schematic diagrams showing the arc heating electrode 5 of the Example 1. The arc heating electrode 5 of Example 1 is configured by four sub electrodes (rod electrodes) 17. FIG. 2A is a perspective view, and FIG. 2B is a plan view. The general construction of the film deposition apparatus is equivalent to that schematically shown in FIG. 1.

As shown in FIGS. 2A and 2B, in this example, to use as the arc heating electrode (first electrode) 5 has a circular tungsten-made ring 16 with four 1 mm-diameter tungsten-made rods (sub electrodes) 17 fixed thereon. The tungsten-made rods 17 are so arranged that the tips thereof each form, lengthwise, an angle of approximately 45 degrees with respect to the vertical direction of the surface of the material 8. Further, the rods 17 are fixed on the circular tungsten-made ring 16 using screws so that the rod tips direct to the melting part 12 of the material 8. In this example, with such an arc heating electrode 5 an electrical wiring is formed by deposition of ultra fine Ag particles. For comparison, another electrical wiring is formed with the tip-pointed rod electrode 101 of the conventional type as shown in FIG. 5.

At the time of film deposition, the current value is kept constant, and the voltage is the parameter, changing the distance between the material and the tip of the electrode 5, i.e., tips of the rod electrodes.

To see whether the generated ultra fine particles are discharged from the nozzle 4 via the transfer tube 3, film is deposited in line through the constant movement of the substrate 10. Then, a sensing-pin type film thickness measurement device is used to measure the film thickness and the cross sectional shape of the deposited film.

Conditions of the film deposition are as follows:
Nozzle Size: circular aperture of 1 mm in diameter
Pressure in Ultra-Fine Particle Generation Chamber: 530 Torr (70490 Pa)
Pressure in Film Deposition Chamber: 1.2 Torr (159.6 Pa)
Arc Current: 50 A
Substrate Movement Speed: 0.1 mm/sec Table 1 shows the voltage dependency result of the film thickness of the linear electrode deposited with the electrode including four rods.

TABLE 1

| Voltage (V) | 20 | 24 | 28 | 32 | 34 |
|---|---|---|---|---|---|
| Film Thickness ($\mu$m) with Electrode of Example 1 | 20 | 22 | 25 | 31 | 38 |
| Film Thickness ($\mu$m) with Conventional Electrode | 11 | 12 | 0 | 0 | 0 |

Table 1 shows that no film is deposited under the voltage 28V or higher with the conventional type electrode used to generating the ultra fine particles.

This is because the ultra-fine particle smoke (particle flow) formed by evaporation of the material 8 is blown off in the direction opposite to the first electrode 101, and thus is not sucked up into the transfer tube 3. This phenomenon is visually observed as well.

On the other hand, in the case of generating the ultra fine particles with the first electrode 5 of this example, most of the ultra-fine particle smoke (particle flow) goes up directly above the material 8, and sucked up into the transfer tube 3. This is visually observed.

Such results tell that the electrode 5 of this example can efficiently allow the generated ultra fine particles to be sucked up into the transfer tube 3.

The results also tell that, the higher the voltage, the thicker the resulting wiring filmed using the electrode of this example becomes. Also, as the arc voltage at the time of film deposition is increased, wiring film deposition can be achieved at higher rate.

Further, the resulting wiring deposited with the conventional electrode under 20V or 24V has a cross section of a shape with a peak of thickness shifted from the center to the edge, and the edge part is thicker than the center part. The cross section of a line deposited under 24V has a shape with a peak of thickness further shifted to the edge compared with that deposited under 20V.

On the other hand, the resulting wiring filmed using the electrode of this example stably has a cross section which has a peak of thickness in the central part regardless of the voltage.

EXAMPLE 2

FIGS. 3A and 3B are both schematic diagrams showing the first electrode (arc discharge electrode) 5 of this example, more specifically, showing the first electrode 5 configured by eight sub electrodes 19. FIG. 3A is a perspective view, and FIG. 3B is a plan view. The general construction of the film deposition apparatus in its entirety is equivalent to the one schematically shown in FIG. 1.

As shown in FIGS. 3A and 3B, in this example, an octangle molybdenum-made jig 18 is provided with eight holes, at equal intervals, to allow 1 mm-diameter rod electrodes (sub electrodes) 19 to pass therethrough. As the rod electrodes 19, used are 1 mm-diameter eight tungsten-made rods 19 to which yttrium oxide ($Y_2O_3$) is doped. Here, the rod electrodes 19 are so arranged that the tips thereof each form, lengthwise, an angle of approximately 45 degrees with respect to the vertical direction of the surface of the material 8. Further, to have the rod tips direct to the melting part 12 of the material 8 so that the rod electrodes 19 are fixed to the octangle molybdenum-made jig 18 with screws. Using such an arc discharge electrode 15 and the material 8 mainly made of Ag, a mirror is produce out of ultra fine Ag particles.

Used as the substrate 10 is a BK7 substrate, and the back of a glass substrate is utilized for the mirror.

As the nozzle 4, used is a nozzle having a slit-shaped aperture, and the substrate is moved in a direction perpendicular to the longer side of the aperture.

For comparison, a film is deposited with such a tip-pointed arc discharge electrode 101 of the conventional type as shown in FIG. 5, made of tungsten to which yttrium oxide ($Y_2O_3$) is doped.

Conditions of the film deposition are as follows:

Nozzle Size: aperture 300 μm×5 mm slit type

Pressure in Ultra-Fine Particle Generation Chamber: 530 Torr (70490 Pa)

Pressure in Film Deposition Chamber: 1.0 Torr (133 Pa)

Arc Current: 25 A

Substrate Movement Speed: 1.25 mm/sec

Substrate Temperature: 300 degrees

After film formation, the resulting linear film having a width of 5 mm is evaluated by average thickness, reflectance in visible regions, and visual inspection of the back surface.

TABLE 2

| | | | | | |
|---|---|---|---|---|---|
| Voltage (V) | 22 | 24 | 26 | 28 | 30 |
| Average Film Thickness (μm) with Electrode of Example 2 | 0.72 | 0.76 | 0.82 | 0.90 | 0.94 |
| Reflectance (%) | 95.3 | 95.3 | 95.6 | 95.6 | 95.7 |
| Visual Inspection | Nothing Wrong | Nothing Wrong | Nothing Wrong | Nothing Wrong | Nothing Wrong |

TABLE 3

| | | | | | |
|---|---|---|---|---|---|
| Voltage (V) | 22 | 24 | 26 | 28 | 30 |
| Average Film Thickness (μm) with Conventional Electrode | 0.15 | 0.14 | 0 | 0 | 0 |
| Reflectance (%) | 94.8 | 94.8 | 8.2 | 8.2 | 8.2 |
| Visual Inspection | Unevenness Observed | Unevenness Observed | No Film | No Film | No Film |

Table 2 shows the film thickness, reflectance with 500 nm wavelength, and visual inspection of the mirror produced with the arc discharge electrode 5 (see FIGS. 3A and 3B) of this example, and Table 3 shows those of the mirror produced with the arc discharge electrode 101 (see FIG. 5) for comparison.

The reflectance in Table 2 tells that the film deposited with the electrode of this example has a mirror plane regardless of the voltage. Moreover, visual with result tells that the mirror plane is evenly reflective in the visual regions regardless of the voltage. In the table, the average film thickness is increased as the voltage gets higher. This is because the evaporation is increased due to the higher arc power. Further, we visually observed that the ultra-fine particle smoke formed as a result of evaporation of the material is sucked up into the center part of the transfer tube 3 no matter what voltage is applied.

On the other hand, with the film deposited with the conventional electrode shown in Table 3, we visually observed that the ultra-fine particle smoke generated under the voltage of 26V is blown off in the direction opposite to the electrode and is not sucked up into the transfer tube. The film thickness and reflectance evaluations show that, with the voltage of 26V or higher, no complete film is deposited on the substrate. In the table, the reflectance is 8.2% under the voltage of 26V or higher. This is because reflections occur to the front and back surface of the substrate itself.

As is known from the above, discharge caused by the electrode of this example allows particle films to be deposited in a stable manner regardless of the voltage.

EXAMPLE 3

Figure 4A:
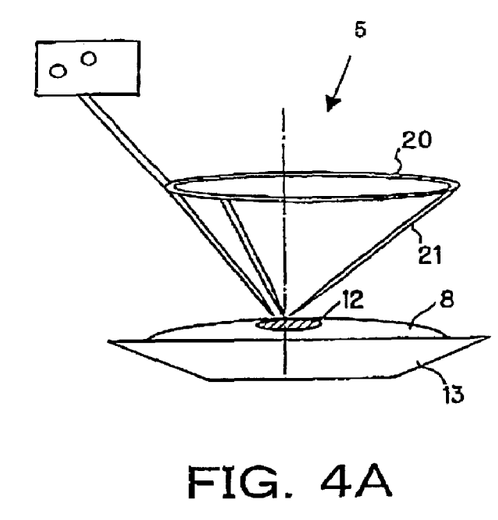
FIGS. 4A to 4D are schematic diagrams showing an electrode provided with three discharge sections in Example 3.
Figure 4B:
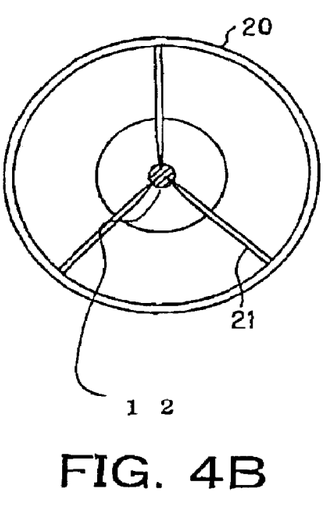
Figure 4C:
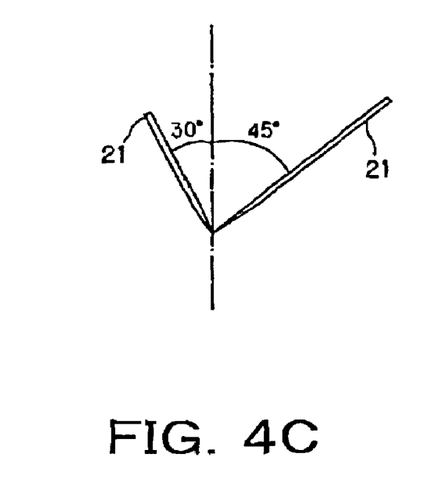
Figure 4D:
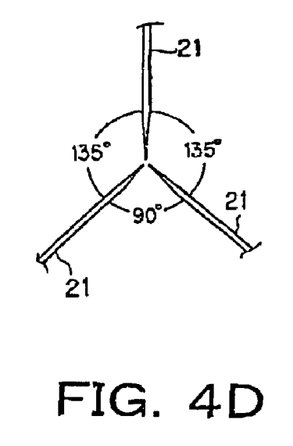

FIGS. 4A to 4D are all schematic diagrams showing the arc heating electrode (first electrode) 5 of this example. In this example, three rod electrodes 21 are used as the sub-electrodes. FIG. 4A is a perspective view, FIG. 4B is a plan view, FIG. 4C is a perspective view of a rod electrode 21, and FIG. 4D is a plan view of the rod electrode 21. The general construction of the film deposition apparatus is equivalent to the one schematically shown in FIG. 1.

In this example, the sub-electrode configured by three carbon rods 21 is used to produce a mirror out of ultra fine Al particles.

The carbon rod 21 is 1 mm in diameter. As shown in FIG. 4C, two of the three rod electrodes 21 are so fixed as to form an angle of 30 degrees with respect to the vertical direction of the surface of the material 8. The remaining one electrode is so fixed as to form an angle of 45 degrees with respect to the vertical direction of the surface of the material 8. The angles between the rods are not the same, and as shown in FIGS. 4B and 4D, the angles viewed from the above are 90°, 135°, and 135°.

Similarly to Example 2, the nozzle 4 having a slit-shaped aperture and the BK7 substrate are used. The substrate is moved in a direction perpendicular to the longer side of the aperture. The back surface of the film plane is evaluated as a mirror in the visual regions.

For comparison, another mirror is produced with such an arc discharge electrode as shown in FIG. 5, which is carbon-made conventional tip-pointed rod electrode 101 of 5 mm in diameter.

Condition of the film deposition is as follows:
Nozzle Size: aperture 300 μm×5 mm slit type
Pressure in Ultra-Fine Particle Generation Chamber: 800 Torr (106400 Pa)
Pressure in Film Deposition Chamber: 2.2 Torr (292.6 Pa)
Arc Current: 20 A
Substrate Movement Speed: 1.25 mm/sec
Substrate Temperature: 300° C.

Under such conditions, the linear thin film is deposed out of the ultra fine particles ejected from the nozzle 4 while moving the substrate 10. Similarly to Example 2, the resulting film is subjected to film thickness check, reflectance check in the visible regions, and visual inspection.

Table 4 shows the results derived from the electrode of this example shown in FIGS. 4A to 4D, and Table 5 shows the results derived from the electrode used for comparison.

Note here that, the reflectance shown in Tables 4 and 5 are values with the wavelength of 500 nm.

TABLE 4

| Voltage (V) | 22 | 24 | 26 | 28 | 30 |
|---|---|---|---|---|---|
| Average Film Thickness (μm) with Electrode of Example 3 | 0.32 | 0.30 | 0.33 | 0.46 | 0.55 |
| Reflectance (%) | 90.1 | 90.5 | 90.2 | 90.3 | 90.6 |
| Visual Inspection | Nothing Wrong | Nothing Wrong | Nothing Wrong | Nothing Wrong | Nothing Wrong |

TABLE 5

| Voltage (V) | 22 | 24 | 26 | 28 | 30 |
|---|---|---|---|---|---|
| Average Film Thickness (μm) with Conventional Electrode | 0.36 | 0.41 | 0 | 0 | 0 |
| Reflectance (%) | 90.6 | 90.3 | 8.2 | 8.2 | 8.2 |
| Visual Inspection | Unevenness Observed | Unevenness Observed | No Film | No Film | No Film |

Table 4 tells that the film deposited with the electrode 5 of this example has a mirror surface regardless of the voltage. Moreover, we observed that the generated particle smoke (particle flow) is sucked up into the center part of the transfer tube 3 regardless of the voltage. In addition, visual inspection result of the back surface tells that the mirror plane is evenly reflective in the visual regions.

On the other hand, with respect to the film deposited for comparison with the conventional electrode shown in Table 5, we observed similarly to Example 2 that the particle smoke generated under the voltage of 26V or higher is blown off in the direction opposite to the electrode 101 and is not sucked up into the transfer tube.

The film thickness and reflectance evaluations show that, with the voltage of 26V or higher, no complete film is deposited on the substrate. In the table, the reflectance is 8.2% under the voltage of 26V or higher. This is because reflections occur to the front and back surface of the substrate itself.

As is known from the above, discharge caused by the electrode of this example allows particle films to be deposited in a stable manner regardless of the voltage.

As described above, the present embodiment employs a gas deposition method in which a metal material is evaporated by arc heating, particles (ultra fine particles) are generated out of the evaporated material, and a film is deposited with the generated particles (ultra fine particles) to form wirings, electrodes, and optical films. Then, under such a gas deposition method of this embodiment enables the resulting particles (ultra fine particle) to be efficiently sucked up into a transfer tube regardless of an arc voltage at the time of particle generation.

Further, even a slight voltage fluctuation occurs, suction into the center part of the transfer tube can be stably achieved. Therefore, at the time of linear film deposition through movement of the substrate, the cross section of the film can be stable in shape.

As described in the above, according to the present invention, regardless of the arc voltage at the time of particle generation, the resulting particles can be efficiently sucked up into the transfer tube.

Further, at the time of linear film deposition through movement of the substrate, the cross section of the film can be stable in shape.

What is claimed is:

1. A film deposition apparatus comprising:
   (a) a first chamber for generating particles containing (i) a first electrode having a plurality of tips arranged so as to face a raw material and (ii) a second electrode electrically connected to the raw material;
   (b) a voltage source for applying a potential difference between the first electrode and the second electrode for generating an arc discharge between the tips and the raw material;
   (c) a second chamber containing a stage for fixing a substrate thereon;
   (d) a tube connecting the first chamber and the second chamber; and
   (e) a carrier gas container for introducing a carrier gas into the first chamber;
   wherein the tips face in different directions from each other relative to the raw material and the tips are in substantially radial alignment to a portion of the raw material.

2. The film deposition apparatus according to claim 1, wherein the plurality of tips are so provided as to heat substantially the same part of the material.

3. The film deposition apparatus according to claim 1, wherein the plurality of tips have rod-like shape and are arranged in different lengthwise directions.

4. The film deposition apparatus according to claim 1, wherein the tips each include a material selected from the group consisting of W, Ta, Mo, and C.

* * * * *